(12) United States Patent
Adan

(10) Patent No.: US 6,204,534 B1
(45) Date of Patent: Mar. 20, 2001

(54) SOI MOS FIELD EFFECT TRANSISTOR

(75) Inventor: Alberto Oscar Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 08/984,083

(22) Filed: Dec. 3, 1997

(30) Foreign Application Priority Data

Jan. 20, 1997 (JP) ................................. 9-0078873

(51) Int. Cl.[7] .......................... H01L 27/01; H01L 27/12; H01L 31/0392; H01L 29/76
(52) U.S. Cl. .......................... 257/347; 257/348; 257/349; 257/350; 257/404
(58) Field of Search .................... 257/392, 365, 257/315, 335, 347, 348, 349, 350, 391, 404

(56) References Cited

U.S. PATENT DOCUMENTS

| | | | |
|---|---|---|---|
| 4,803,530 | * 2/1989 | Taguchi et al. | 357/23.7 |
| 4,845,047 | * 7/1989 | Holloway et al. | 437/45 |
| 4,907,041 | * 3/1990 | Huang | 357/4 |
| 5,245,207 | * 9/1993 | Mikoshiba et al. | 257/392 |
| 5,250,835 | * 10/1993 | Izawa | 257/408 |
| 5,272,369 | * 12/1993 | Colinge et al. | 257/352 |
| 5,378,913 | 1/1995 | Hoeltge . | |
| 5,528,056 | * 6/1996 | Shimada et al. | 257/72 |
| 5,543,652 | * 8/1996 | Ikeda et al. | 257/377 |
| 5,801,416 | * 9/1998 | Choi et al. | 257/335 |
| 5,841,170 | * 11/1998 | Adan et al. | 257/345 |

FOREIGN PATENT DOCUMENTS

| | | |
|---|---|---|
| 0 359 528 A2 | 3/1990 | (EP) . |
| 0 449 351 A1 | 10/1991 | (EP) . |
| 0 586 735 A1 | 3/1994 | (EP) . |
| 5-218425 | 8/1993 | (JP) . |
| 406021454 | * 1/1994 | (JP) ................................ 257/350 |

OTHER PUBLICATIONS

De Ceuster et al, "Kink–Like Effect in Long N–Channel Twin–Gate Fully Dipleted SOI Mosfets", Electronics Letter, vol. 30, No. 17, Aug. 18, 1994, pp. 1456–1458.

Colinge et al, "A Lateral COMFET Made in Thin Silicon–on–Insulator Film", IEEE Electron Device Letters, vol. Ed1–7, No. 12, Dec. 1986, pp. 697–699.

"Dual–MOSFET structure for suppression of kink in SOI MOSFET's at room and liquid helium temperatures" 1990 IEEE SOI Conference, pp. 13–14.

* cited by examiner

Primary Examiner—David Hardy
Assistant Examiner—Jesse A. Feny
(74) Attorney, Agent, or Firm—Nixon & Vanderhye P.C.

(57) ABSTRACT

A SOI MOS field effect transistor includes: a superficial top semiconductor layer of a first conductivity type formed on a SOI substrate; source and drain regions of a second conductivity type arranged apart from each other on the top semiconductor layer; a P-type first channel region, an $N^+$-type floating region, and a P-type second channel region formed in this order in a self-aligned manner and disposed between the $N^+$-type source region and the $N^+$-type drain region for an N-type MOSFET, or an N-type first channel region, a $P^+$-type floating region, and an N-type second channel region formed in this order in a self-aligned manner and disposed between the $P^+$-type source region and the $P^+$-type drain region for a P-type MOSFET; and two gate electrodes for controlling the first and second channel regions, wherein a doping concentration of the second channel region adjacent to the drain region is lower than a doping concentration of the first channel region adjacent to the source region.

9 Claims, 5 Drawing Sheets

Source-Drain Voltage Vds

Threshold Voltage Ratio: Vth1/Vth2

SOI MOSFET

Bulk MOSFET

L1=0.35um, L2=0.35um

L1=0.8um, L2=0.35um

SOI MOS FIELD EFFECT TRANSISTOR

CROSS-REFERENCES TO RELATED APPLICATIONS

This application is related to Japanese Patent Application No. HEI 9(1997)-007873, filed on Jan. 20, 1997 whose priority is claimed under 35 USC §119, the disclosure of which is incorporated herein by reference in its entirety.

BACKGROUND OF THE INVENTION

1. Field of the Invention

The present invention relates to a SOI MOS (Silicon-On-Insulator Metal Oxide Semiconductor) field effect transistor, namely, to a semiconductor device realized on a SOI substrate. More particularly, the present invention relates to an improvement of SOI MOS field effect transistor (called hereunder, MOSFET), which is applicable to integrated circuits.

2. Description of the Related Arts

SOI MOSFETS fabricated on SOI substrates like SOS (Silicon On Sapphire), SIMOX (Silicon Separation by Ion Implantation of Oxygen) and BSOI (Bonded SOI) offer advantages in low-voltage and high-speed operation. Additionally, SOI MOSFETs result in smaller layout area as compared with devices fabricated on bulk Si. On the other hand, SOI MOSFETs have only three terminals (gate, drain, and source), while the bulk Si devices require four terminals (gate, drain, source, and substrate). Because of this fact, the SOI MOSFET operates as a floating body device.

FIGS. 4(a) and 4(b) show schematic cross sections of MOSFETs of prior art Example 1 and their equivalent circuits. FIG. 4(a) shows a schematic cross section of a SOI NMOSFET and its equivalent circuit, while FIG. 4(b) shows a schematic cross section of a Bulk NMOSFET and its equivalent circuit.

Also, the equivalent circuits shown in FIGS. 4(a) and 4(b) show a parasitic bipolar NPN transistor and include an impact ionization current generator Ii.

In the case of the Bulk MOSFET, the bipolar transistor base terminal B is tied to the substrate terminal B, the substrate/source junction is reverse biased and, as a result, the bipolar transistor has very little effect on the MOSFET operation.

In the SOI MOSFET, the parasitic bipolar base is the transistor body (floating). In normal operation, impact ionization current generated at the drain junction could act as a base current for the parasitic bipolar transistor, creating a positive feedback effect and degrading device electrical characteristics, specially short-channel effect and reduction of the drain/source breakdown voltage. This parasitic bipolar effect imposes a serious limitation for device integration.

For SOI MOSFETS with sub-halfmicron feature sizes (channel length<0.35 $\mu$m), drain/source breakdown voltage of approximately BVdss~2.5 V is typical. As a result, the maximum supply voltage should be Vddmax~2 V. This limitation prevents the use of these SOI MOSFETs for Vdd~3 V.

Possible methods to overcome this limitation are as follows.

In the case of SOI MOSFETs according to the prior art Example 1, the method involves constructing the SOI MOSFETs on thicker top Si film and using body contacts to tie the channel region to a fixed potential. This behaves as a bulk Si device suppressing the floating body effect and the parasitic bipolar effect, thereby preventing the decrease in the breakdown voltage between the source and the drain.

As a prior art Example 2, a MOSFET is proposed which is disclosed in Japanese Unexamined Patent Publication (Kokai) No. Hei 5-218425.

FIGS. 5(a) shows a schematic cross section of the MOSFET according to the prior art Example 2; and FIG. 5(b) is a graph showing drain current-voltage characteristics. This device can be described by the series connection of two SOI MOSFETs with the common drain (13 in FIG. 5(a)) electrically floating. The channel length of each MOSFET is d, as indicated in FIG. 5(a).

More specifically, the device comprises an active layer on an insulator film 12 formed on a silicon substrate 11. The active layer comprises an N-type active region (floating N-type region) 13 and P-type active regions 14, 15 sandwiching this N-type active region 13. Of the electron-hole pairs generated near the junction of the N-type drain region 19, the carriers bearing the P-type are injected into the N-type active region 13. Since the impurity concentration of the N-type active region 13 typically is lower by four orders of magnitude than that of the N-type source region 18, the amount of reverse-injected N-type carriers is extremely suppressed. The reference numerals 17, 20, 21, 22 represent a gate electrode, an insulator film, a source electrode, and a drain electrode, respectively.

Therefore, the MOSFET according to prior art Example 2 suppresses deterioration of the breakdown voltage between the source and drain regions due to parasitic bipolar effect. FIG. 5(b) shows drain current-voltage characteristics (Id-Vds characteristics) when the gate lengths are adjusted so that L1=L2=0.35 $\mu$m in the construction of a MOSFET shown in FIG. 5(a).

As a prior art Example 3, a MOSFET is proposed which is disclosed in M. H. Gao et al.: "Dual-MOSFET structure for suppression of kink in SOI MOSFETs at room and liquid helium temperatures", 1990 IEEE SOI Conference, pp. 13–14.

FIGS. 6(a) to 6(d) are views showing a schematic cross section, a layout, and drain current-voltage characteristics of the MOSFET according to the prior art Example 3. Basically, two transistors are connected in series, then electrically, this configuration is equivalent to that of the MOSFET shown in FIG. 5(a).

More specifically, FIG. 6(a) is a view showing a schematic cross section of the dual device in which two NMOSFETs are connected in series. FIG. 6(b) is a plan view showing a layout of the dual device. FIG. 6(c) is a view showing drain current-voltage characteristics of a single device (in dotted line) and drain current-voltage characteristics of a dual device (in solid line).

The "kink" effect is a sudden increase in the drain saturation current Id at a certain source-drain voltage Vds relative to the input gate voltage Vgs, as shown by the drain current-voltage characteristics in dotted line of FIG. 6(c). The "kink" effect appears when the top channel adjacent to the drain enters the source-drain punchthrough regime.

In the drain current-voltage characteristics shown by the solid line of FIG. 6(c), the "kink" effect is reduced by increasing the channel length of one of the transistors.

FIG. 6(d) shows drain current-voltage characteristics when the gate lengths of the two elements are adjusted so that L1=0.8 $\mu$m and L2=0.35 $\mu$m. As shown, the "kink" effect (kink current) in the drain current-voltage characteristics is reduced.

However, the SOI MOSFET device structures of the prior art Examples 1 to 3 described in the previous section have limitations that restrict the use in high density integrated circuits.

(1) In the prior art Example 1, SOI MOSFETs fabricated on thick top Si film degrades short channel effects. Furthermore, the need for a body contact complicates the layout and increases device area.

(2) The MOS transistor of FIG. 5(a) according to prior art Example 2 is difficult to implement for minimum size submicron channel length devices.

2-1) For 0.35 μm gate length device, the channel length of each P-type region 14 and 15 would be d~0.1 μm. This length is very much comparable to the lateral diffusion of $N^+$-type impurity. Therefore, control is extremely difficult and electrical characteristics are liable to have a large variation.

2-2) Furthermore, for this kind of MOSFET according to the prior art Example 2 with the same channel lengths (L1=L2=0.35 μm) for P-type regions 14 and 15 and the threshold voltage ratio being set to have Vth1/Vth2=1, it is experimentally found that there is a very large "kink" current generated in the drain current-voltage characteristics, as illustrated in FIG. 5(b).

(3) In the prior art Example 3, the "kink" effect can be greatly reduced by adjusting the channel lengths of the transistors of the dual element, as shown in FIG. 6(b). This is due to the fact that the transistor driving current is reduced since Id decreases as the channel length grows larger. However, since the gate lengths for this structure are such that L1/L2=0.8 μm/0.35 μm, there is a problem that, even if L2 is the minimum size, the device area will increase due to the large dimension of L1 (non-minimum size).

SUMMARY OF THE INVENTION

The present invention has been made in view of the above-described circumstances and the purpose thereof is to provide a SOI MOS field effect transistor which, for example, increases the breakdown voltage between the source and drain regions, suppresses the kink effect in the drain current-voltage characteristics, and reduces the device area, and which is applicable to highly integrated circuits.

Accordingly, the present invention provides a SOI MOS field effect transistor comprising: a superficial top semiconductor layer of a first conductivity type formed on a SOI substrate; source and drain regions of a second conductivity type arranged apart from each other on the top semiconductor layer; a P-type first channel region, an $N^+$-type floating region, and a P-type second channel region formed in this order in a self-aligned manner and disposed between the $N^+$-type source region and the $N^+$-type drain region for an N-type MOSFET, or an N-type first channel region, a $P^+$-type floating region, and an N-type second channel region formed in this order in a self-aligned manner and disposed between the $P^+$-type source region and the $P^+$-type drain region for a P-type MOSFET; and two gate electrodes for controlling the first and second channel regions, wherein a doping concentration of the second channel region adjacent to the drain region is lower than a doping concentration of the first channel region adjacent to the source region.

DETAILED DESCRIPTION OF THE PREFERRED EMBODIMENTS

The present invention provides a SOI MOS field effect transistor that increases the breakdown voltage between the source and drain regions and suppresses the kink effect in the drain current-voltage characteristics.

According to the present invention, the breakdown voltage between the drain and source regions can be increased by constructing the SOI MOS field effect transistor with a dual transistor having two channel regions. Further, the kink effect in the drain current-voltage characteristics (Id-Vds characteristics) is suppressed by allowing the concentration of the second channel region adjacent to the drain region to be lower than the concentration of the first channel region adjacent to the source region.

Preferably, the threshold voltage Vth2 of the second channel region is lower than the threshold voltage Vth1 of the first channel region by adjusting the doping concentrations of the first and second channel regions. This structure suppresses the "kink" effect in the drain current-voltage characteristics.

Preferably, the ratio Vth1/Vth2 of the threshold voltage Vth1 of the first channel region relative to the threshold voltage Vth2 of the second channel region is more than 4. This structure eliminates the "kink" effect in the drain current-voltage characteristics.

Preferably, the second channel region comprises an undoped channel of intrinsic-type. This structure allows the threshold voltage Vth2 of the second channel region to be lower than the threshold voltage Vth1 of the first channel region by setting the doping concentration of the second channel region to be, for example, less than $1\times10^{14}$ cm$^{-3}$ and forming the first channel region at an ordinary doping concentration of about $2\times10^{17}$ cm$^{-3}$ (boron).

Preferably, the channel lengths of the first and second channel regions are the same. This structure realizes a SOI MOSFET in a smaller device area than the previous art by allowing the channel lengths of the first and second channel regions to be of the same minimum size.

EXAMPLES

The following describes in detail a field effect transistor in accordance with several embodiments of the present invention.

Figure 1:
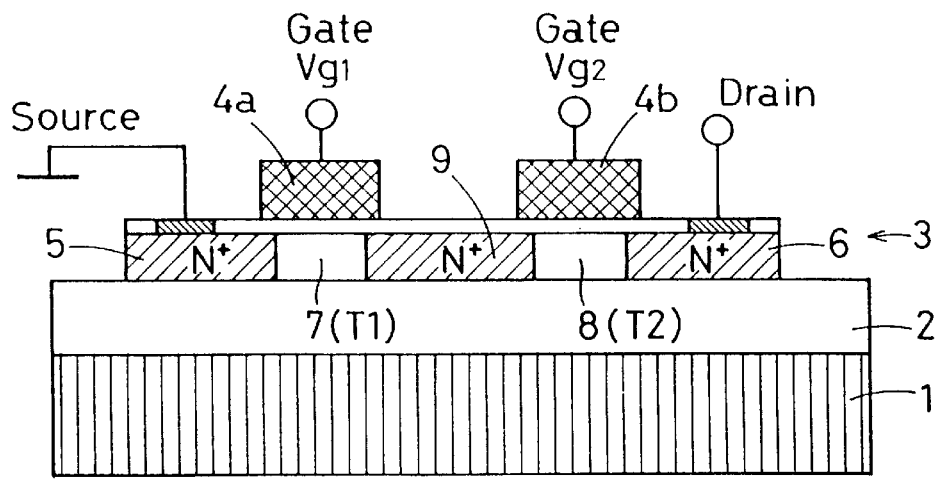
FIG. 1 is a view showing a schematic cross section of a SOI MOSFET according to an embodiment of the present invention.

FIG. 1 is a view showing a schematic cross section of a field effect transistor on SOI substrate in accordance with an embodiment of the present invention.

Referring to FIG. 1, the field effect transistor is formed on a SOI substrate composed of a substrate 1, a buried oxide 2 of thickness Tbox (typically between 50 nm and 500 nm), and a top Si layer 3, where an active transistor is formed. The MOS field effect transistor has gate electrodes 4a and 4b formed of a polysilicon or a refractory metal like $MoSi_2$ (molybdenum silicon), $WSi_2$ (tungsten silicon). Source 5 and drain 6 regions are highly doped to reduce interconnect resistance.

In the case of N-type MOSFET, the source 5 and drain 6 regions are formed as $N^+$ type. A P-type first channel region 7, an $N^+$-type floating region 9, and an i-type second channel region 8 are formed in this order in a self-aligned manner and disposed between the $N^+$ type source 5 and drain 6 regions.

In the case of P-type MOSFET, the source 5 and drain 6 regions are formed as $P^+$ type. An N-type first channel region 7, a $P^+$-type floating region 9, and an i-type second channel region 8 are formed in this order in a self-aligned manner and disposed between the $P^+$ type source 5 and drain 6 regions.

The gate electrode is split into two gate electrodes 4a and 4b, as shown in FIG. 1. The split-gate electrodes 4a and 4b control the two channel regions 7 and 8, which are separated by the floating region 9 of the same conductivity type as the source 5 and drain 6 regions.

The channel region 7 adjacent to the source region 5 is of the opposite conductivity of the source region 5 (P-type in the case of an N-type MOSFET). Typically, doping level in the channel region 7 is about $2 \times 10^{17}$ cm$^{-3}$ (boron). The channel region 8 adjacent to the drain region 6 is non-doped, of intrinsic type (i-type), or very low doped, as compared with the channel region 7. Typically, doping level in the channel region 8 is less than $1 \times 10^{14}$ cm$^{-3}$.

The floating region 9 is formed in a self-aligned manner with the source 5 and drain 6 regions. The doping level is the same and is $1 \times 10^{20}$ cm$^{-3}$. The width of the floating region 9 is about 0.4 μm. Since the structure of the MOSFET is formed in a self-aligned manner, the impurity hardly diffuses laterally, so that the device characteristics are well controlled and reproducible.

Figure 5A:
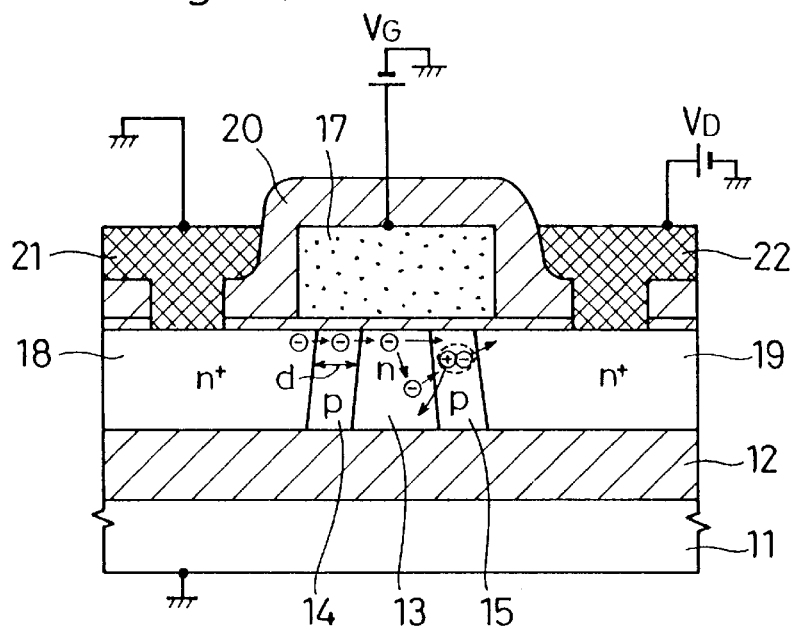
FIGS. 5(a) and 5(b) are views showing a schematic cross section and drain current-voltage characteristics of the MOSFET according to prior art Example 2.
Figure 5B:
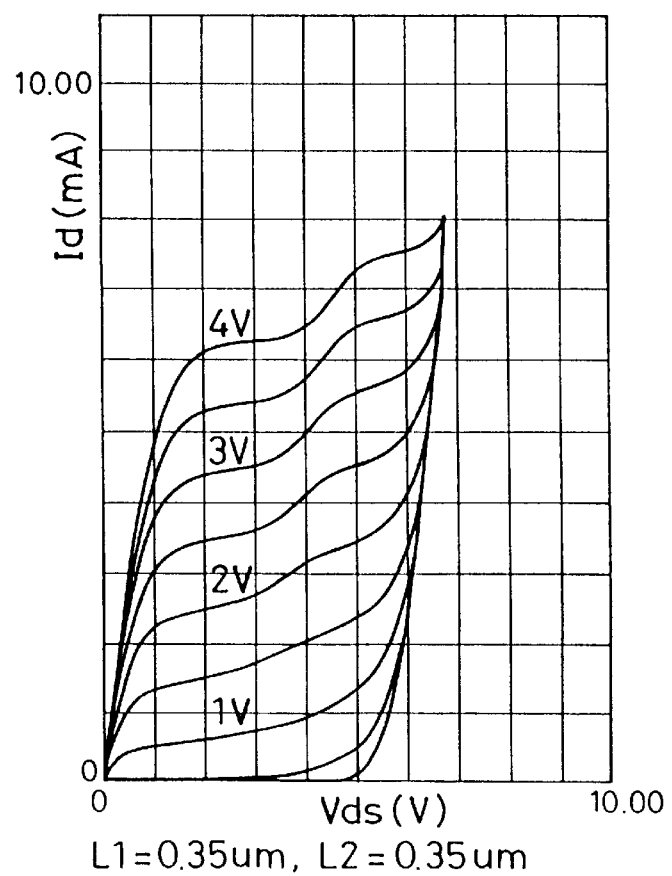
Figure 6A:
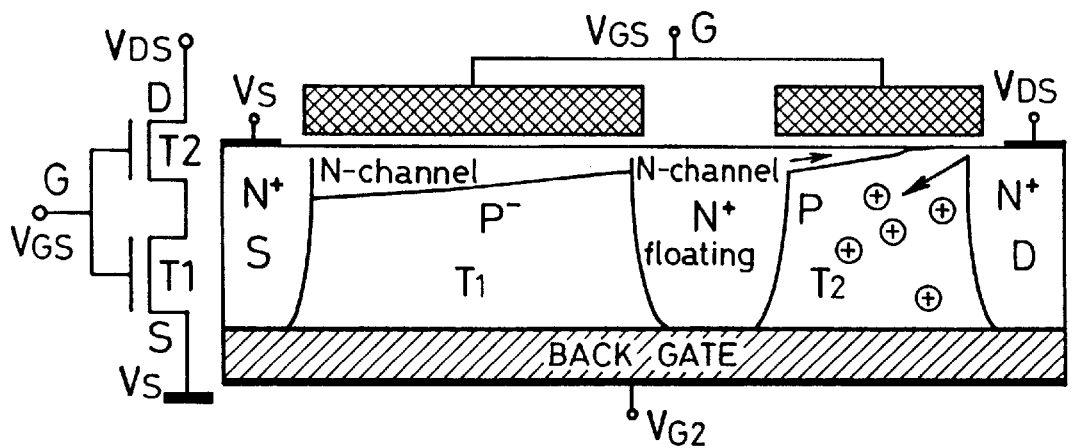
FIGS. 6(a) to 6(d) are views showing a cross section, a layout, and drain current-voltage characteristics of the MOSFET according to prior art Example 3.
Figure 6C:
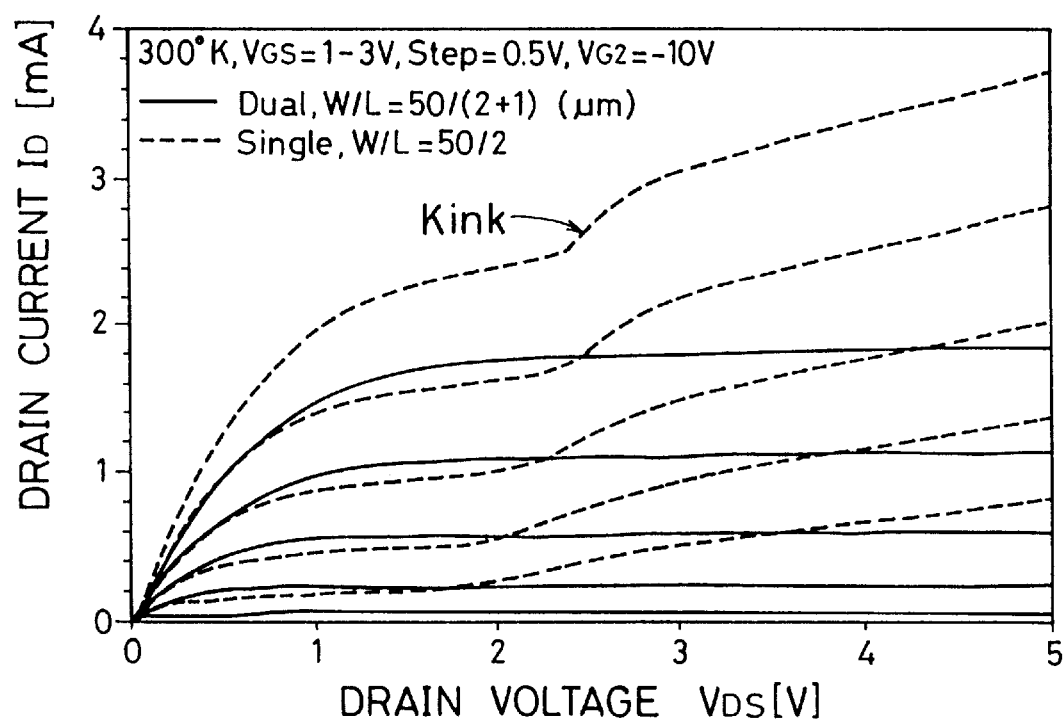
Figure 6B:
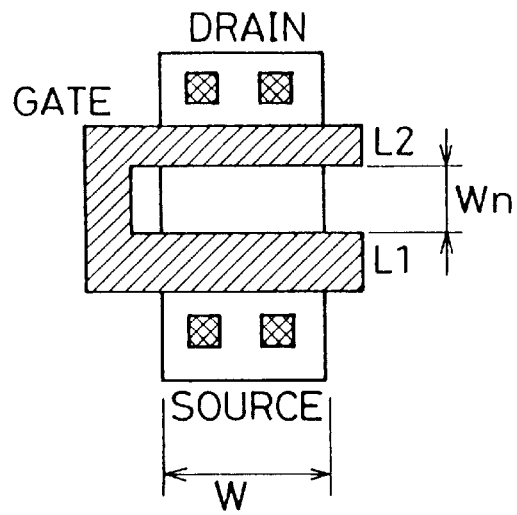
Figure 6D:
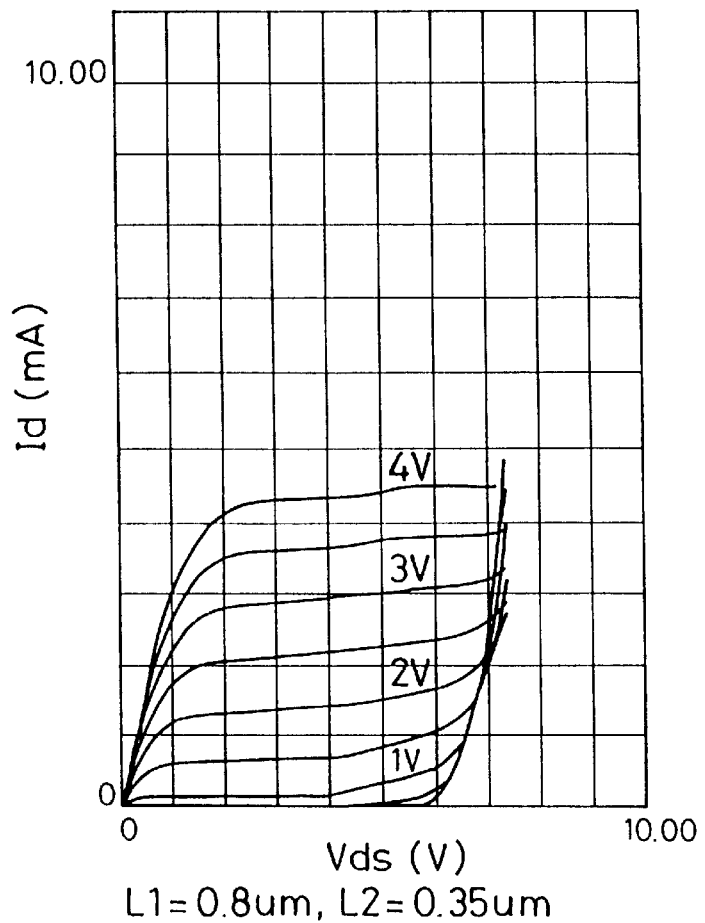

Electrically, this device structure behaves as a series connection of two MOSFETs. In this sense, it is similar to SOI MOSFETs proposed in the prior art Example 2 of FIG. 5 and the prior art Example 3 of FIG. 6. However, the MOSFET according to this embodiment is constructed as follows.

(1) The device area is minimized by a split-gate structure with stacked channel regions (half transistors) of the same minimum gate length.

For example, for a transistor with a width of W, it is assumed that the drain current of Id=6 mA is to be obtained under the same driving current and with gate voltage Vgs= drain voltage Vds=4 V. In order to achieve this drain current Id:

In the prior art Example 3 shown in FIG. 6, since the area is equal to (L1+L2+Wn)×W, the area of the prior art Example 3 will be 21.7 μm$^2$ provided that L1=0.8 μm, L2=0.35 μm, Wn=0.4 μm, and W=14 μm required for Id=6 mA.

In the embodiment of the present invention shown in FIG. 1, the area of the embodiment will be 11 μm$^2$, provided that L1=0.35 μm, L2=0.35 μm, Wn=0.4 μm, and W=10 μm required for Id=6 mA, thus reducing the area to about half. This structure allows to realize a MOSFET with high source-drain punchthrough breakdown voltage in a smaller area than the previous art.

(2) The channel region 8 adjacent to the drain region 6 is formed to be very low doped or of intrinsic type.

(3) The condition of Idsat2>Idsat1 is obtained by controlling the doping concentration of the channel region 7 adjacent to the source region 5 to adjust the two threshold voltages to satisfy Vth1>Vth2.

In this embodiment of the present invention, the threshold voltage Vth1 of the channel region 7 is adjusted to be Vth1=0.4 V and the threshold voltage Vth2 of the channel region 8 is adjusted to be Vth2=0.1 V.

This allows suppression of the kink current in the drain current-voltage characteristics and to increase the punch-through breakdown voltage between the source and drain regions.

This is achieved by the following mechanism. Basically, to reduce or eliminate the "kink" effect, the saturation current Idsat1 of the T1 transistor must be smaller than the saturation current Idsat2 of the T2 transistor adjacent to the drain: Idsat2>Idsat1.

Figure 2A:
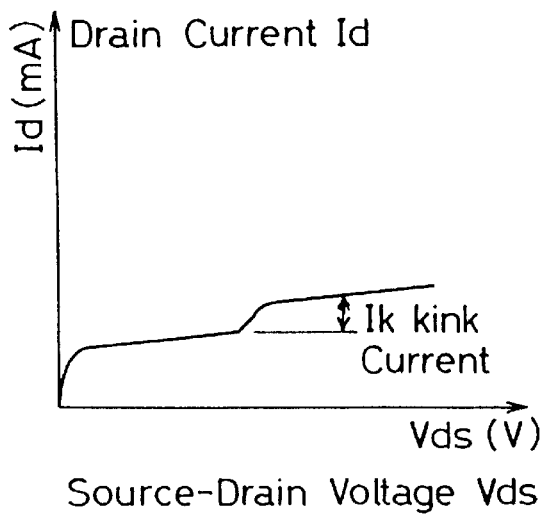
FIGS. 2(a) and 2(b) are views showing a relationship between the kink current Ik and the threshold voltage ratio in the SOI MOSFET according to the embodiment of the present invention.

In the case where Idsat2<Idsat1, the "kink" current Ik appears when the T2 transistor is operating in the avalanche (or punchthrough) mode and the T1 transistor is in saturation (See FIG. 2(a)).

In the case where Idsat2 >Idsat1, the "kink" current Ik does not appear, since the transistor T2 operates always in triode or saturation regime, while the T1 transistor is in saturation.

Figure 2B:
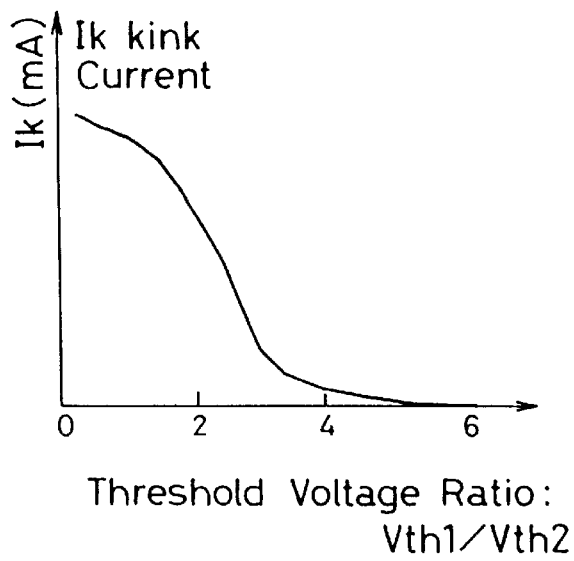

FIGS. 2(a) and 2(b) are views showing a relationship between the kink current Ik and the threshold voltage ratio Vth1/Vth2 in the SOI MOSFET according to this embodiment of the present invention.

FIG. 2(a) shows kink current Ik in the drain current-voltage characteristics of the SOI MOSFET having a split-gate structure with the gate lengths of L1=L2=0.35 μm.

Referring to FIG. 2(b), it will be appreciated that, to reduce the kink current Ik, the threshold voltages Vth1 and Vth2 of the channel regions 7 and 8 should satisfy the relation: Vth1>Vth2, and the threshold voltage ratio Vth1/Vth2 of more than 4 is particularly effective in reducing the kink current Ik.

In this embodiment, the threshold voltage Vth1 of the channel region 7 is adjusted so that Vth1=0.4 V, and the threshold voltage Vth2 of the channel region 8 is adjusted so that Vth2=0.1 V.

Figure 3:
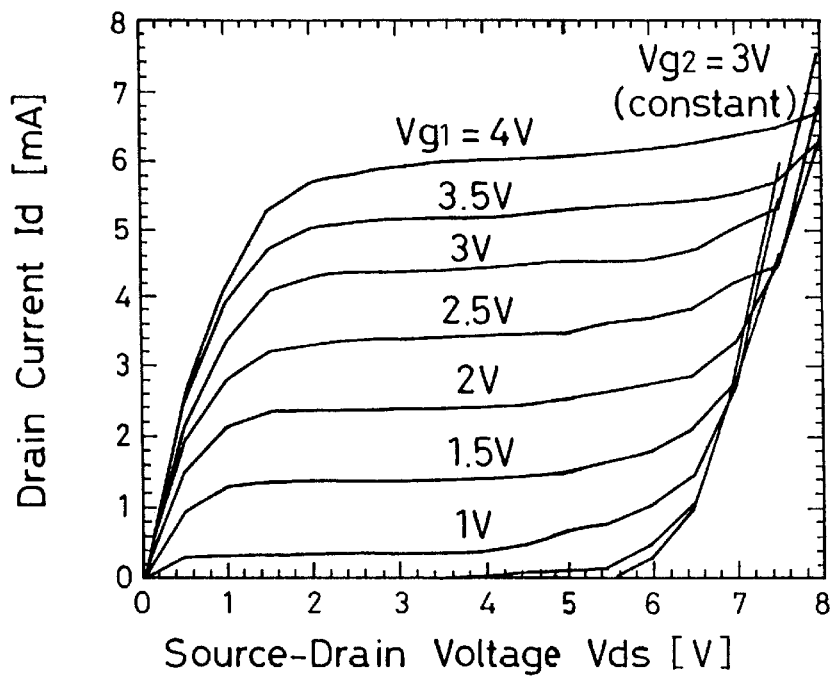
FIG. 3 is a view showing the drain current-voltage characteristics in the SOI MOSFET according to the embodiment of the present invention.
Figure 4A:
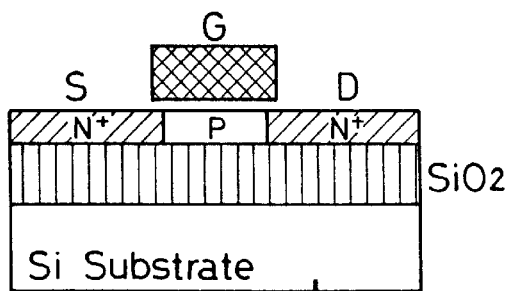
FIGS. 4(a) and 4(b) are views showing schematic cross sections of the MOSFETs according to prior art Example 1 and their equivalent circuits.
Figure 4A:
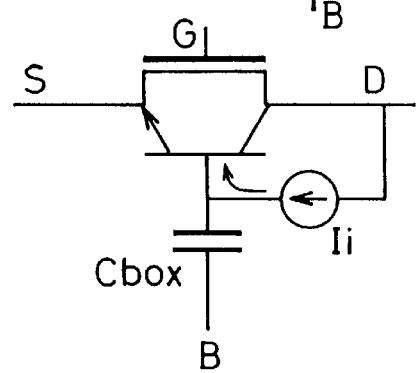
Figure 4B:
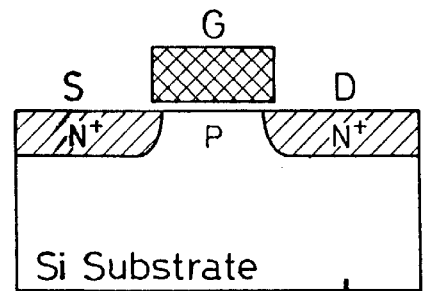
Figure 4B:
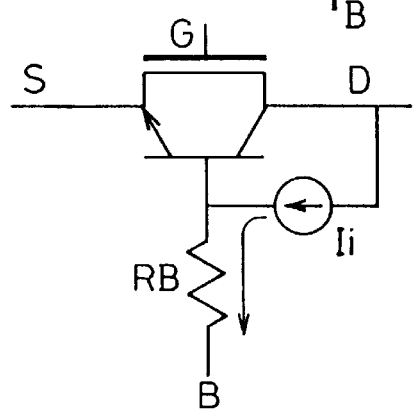

FIG. 3 is a view showing the drain current-voltage characteristics in the SOI MOSFET according to this embodiment of the present invention. FIG. 3 shows the drain current-voltage characteristics of the SOI MOSFET having a split-gate structure with the gate lengths of L1=L2=0.35 μm, where the "kink" effect is eliminated.

The channel region 7 adjacent to the source region 5 is doped at a concentration of about $2 \times 10^7$ cm$^{-3}$ (boron), while the channel region 8 adjacent to the drain region 6 is undoped or of intrinsic type. This provides that the channel region 8 (half transistor) adjacent to the drain region 6 is driven by a larger current than the channel region 7 (half transistor) adjacent to the source region 5.

The above structure provides a SOI MOS field effect transistor having dual-doped channel regions which are controlled by different gate electrode potentials.

A key feature is the low-doped channel region adjacent to the drain terminal, and the adjustment of the doping concentration of the channel region adjacent to the source in order to suppress the "kink" current effect without reducing the driving current.

This structure allows to realize a transistor with high source-drain punchthrough voltage and attains high driving current in a smaller device area than the previous art.

Accordingly, this transistor structure is useful to realize a high voltage interface circuitry necessary in general IC applications. In such a case, the full advantage of the low-voltage SOI circuit, and the I/O circuits can be optimized independently.

Further, the device characteristics have good reproducibility, since each region in the MOSFET is formed in a self-aligned manner, without controlling the width by lateral diffusion.

Thus, the present invention increases the breakdown voltage between the source and drain regions by forming two channel regions between the source and drain regions, and suppresses the kink effect in the drain current-voltage characteristics by controlling the doping concentrations of the two channel regions to adjust the threshold voltages in the two channel regions.

Although the present invention has fully been described by way of example with reference to the accompanying drawings, it is to be understood that various changes and modifications will be apparent to those skilled in the art. Therefore, unless otherwise such changes and modifications depart from the spirit and scope of the invention, they should be construed as being included therein.

What I claim is:

1. A SOI MOS field effect transistor comprising:
    a semiconductor layer formed on an insulating substrate;
    source and drain regions of a first conductivity type arranged apart from each other on the semiconductor layer;
    a first channel region of a second conductivity type, a floating region of the first conductivity type, and a second channel region of the second conductivity type formed in this order in a self-aligned manner and disposed between the source region and the drain region; and
    two gate electrodes for controlling the first and second channel regions,
    wherein an impurity concentration of the second channel region adjacent to the drain region is lower than an impurity concentration of the first channel region adjacent to the source region.

2. The SOI MOS field effect transistor of claim 1, in which the impurity concentrations of the first and second channel regions are adjusted so that a threshold voltage Vth2 of the second channel region is lower than a threshold voltage Vth1 of the first channel region.

3. The SOI MOS field effect transistor of claim 2, in which the impurity concentrations of the first and second channel regions are adjusted so that the ratio Vth1/Vth2 of the threshold voltage Vth1 of the first channel region relative to the threshold voltage Vth2 of the second channel region is more than 4.

4. The SOI MOS field effect transistor of claim 1, in which the impurity concentration of the first channel region is more than about $1 \times 10^{17}$ cm$^{-3}$ and the impurity concentration of the second channel region is less than about $1 \times 10^{16}$ cm$^{-3}$.

5. The SOI MOS field effect transistor of claim 1, in which channel lengths of the first and second channel regions are the same.

6. The SOI MOS field effect transistor of claim 1, in which the source and drain regions comprise N$^+$-type source and drain regions, the first channel region comprises a P-type first channel region, the floating region comprises an N$^+$-type floating region, and the second channel region comprises a P-type second channel region.

7. The SOI MOS field effect transistor of claim 1, in which the source and drain regions comprise P$^+$-type source and drain regions, the first channel region comprises an N-type first channel region, the floating region comprises a P$^+$-type floating region, and the second channel region comprises an N-type second channel region.

8. The SOI MOS field effect transistor of claim 1, in which a first voltage is applied to one of said two gate electrodes and a second different voltage is applied to the other of said two gate electrodes to control the first and second channel regions.

9. A SOI MOS field effect transistor comprising:
    a semiconductor layer formed on an insulating substrate;
    source and drain regions of a first conductivity type arranged apart from each other on the semiconductor layer;
    a first channel region, a floating region of the first conductivity type, and a second channel region formed in this order in a self-aligned manner and disposed between the source region and the drain region; and
    two gate electrodes for controlling the first and second channel regions,
    wherein the first channel region adjacent to the source region is a channel region of a second conductivity type and the second channel region adjacent to the drain region comprises an undoped channel of intrinsic-type.

* * * * *

UNITED STATES PATENT AND TRADEMARK OFFICE
CERTIFICATE OF CORRECTION

PATENT NO. : 6,204,534 B1  
DATED : March 20, 2001  
INVENTOR(S) : Adan

It is certified that error appears in the above-identified patent and that said Letters Patent is hereby corrected as shown below:

Title page,
Item [30] ("Foreign Application Priority Data"), the priority information should read as follows:
-- Jan. 20, 1997 (JP)................9-007873 --

Signed and Sealed this

Thirtieth Day of October, 2001

Attest:

NICHOLAS P. GODICI  
*Acting Director of the United States Patent and Trademark Office*

*Attesting Officer*